United States Patent [19]

Frisbie

[11] Patent Number: 5,124,637
[45] Date of Patent: Jun. 23, 1992

[54] TESTING APPARATUS HAVING A PART GUIDE

[75] Inventor: Milo W. Frisbie, Mesa, Ariz.

[73] Assignee: Motorola, Inc., Schaumburg, Ill.

[21] Appl. No.: 546,201

[22] Filed: Jun. 29, 1990

[51] Int. Cl.⁵ .................. G01R 31/02; H01R 15/635
[52] U.S. Cl. .................. 324/158 F; 439/70; 439/526
[58] Field of Search .......... 324/158 R, 158 F, 158 P, 324/72.5; 439/68, 69, 70, 261, 525, 526, 374, 68, 71; 29/574

[56] References Cited

U.S. PATENT DOCUMENTS

| | | | |
|---|---|---|---|
| 4,102,039 | 7/1978 | Henrickson et al. | 29/574 |
| 4,417,777 | 11/1983 | Bamford | 439/526 |
| 4,564,251 | 1/1986 | Hansen et al. | 324/158 F |
| 4,601,525 | 7/1986 | Kandybowski | 439/68 |
| 4,637,670 | 1/1987 | Coller et al. | 439/526 |
| 4,676,571 | 6/1987 | Petersen et al. | 439/68 |
| 4,853,626 | 8/1989 | Resler | 324/158 F |
| 4,897,602 | 1/1990 | Lin et al. | 324/158 F |
| 4,934,944 | 6/1990 | Kozel et al. | 439/68 |
| 4,936,783 | 6/1990 | Petersen | 439/70 |
| 4,940,935 | 7/1990 | Riley | 324/158 F |
| 4,962,356 | 10/1990 | Eberlein et al. | 324/158 F |

Primary Examiner—Vinh Nguyen
Attorney, Agent, or Firm—Miriam Jackson

[57] ABSTRACT

A testing apparatus utilizes a part guide rather than locating pins to align a molded carrier ring product to contacts of the testing apparatus. The part guide is fabricated so that the inside edges are just slightly larger than the maximum width across the molded carrier ring leads. A contact spacer is used to keep the contacts from touching each other. The contacts are easily replaced by replacing the contact assembly, because they do not need to be soldered to the testing apparatus. The part guide may be fabricated of metal, thus making it very durable.

5 Claims, 2 Drawing Sheets

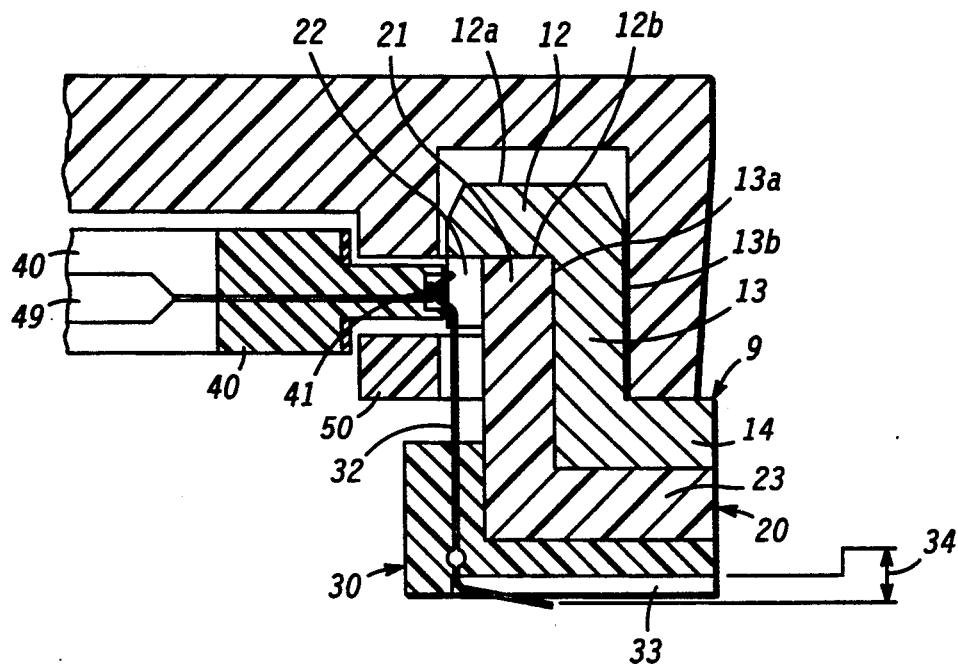
FIG. 3
FIG. 4
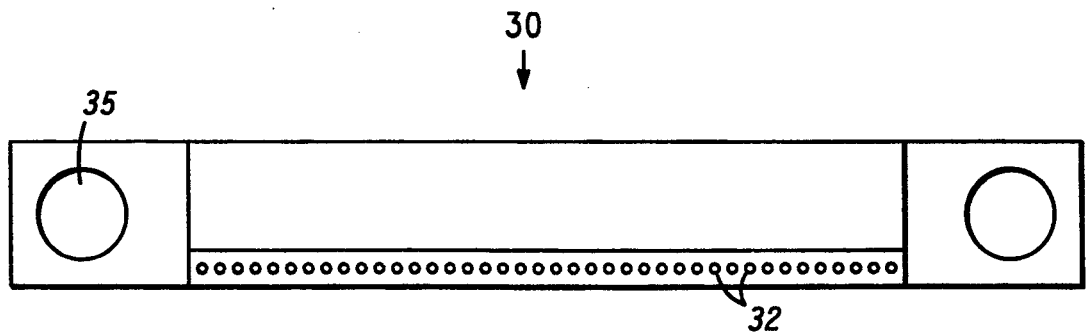

TESTING APPARATUS HAVING A PART GUIDE

BACKGROUND OF THE INVENTION

This invention relates, in general, to the testing of semiconductor devices, and more particularly, to an apparatus for testing semiconductor devices.

Semiconductor devices of various sizes may be packaged in a molded carrier ring product. A molded carrier ring product is illustrated in greater detail in U.S. Pat. No. 4,102,039, which issued to Henrickson et al on Jul. 25, 1978, and is hereby incorporated by reference. A molded carrier ring product allows for the testing of these devices in one apparatus. In the past, the testing of semiconductor devices packaged in a molded carrier ring or similar package thereto, has been accomplished by a pick and place method using a locating pin on the testing apparatus and small holes in the leadframe of the molded carrier ring product for location. Because the leadframe is only 0.128 mm thick, any contact forces against the side of the locating pins could cause leadframe damage and an improper alignment. Not only are the molded carrier ring products hard to align in this testing apparatus, but a complicated procedure is involved in fabricating the testing apparatus. Another disadvantage of this prior art design is that the contacts, the wires which make electrical contact to the leads of the semiconductor device, are soldered to the whole testing apparatus and the test board, thus making it difficult to replace contacts that are damaged. In addition, the contacts used in the prior art are made of beryllium copper, thus requiring approximately 11 Kg of insertion pressure during testing. A further disadvantage of the prior art design is that each testing apparatus is very expensive as a result of the complicated fabrication process.

As can be seen, it would be desirable to provide a new testing apparatus that makes it easier to obtain proper alignment that is much sturdier, less expensive, and that uses less kilograms of insertion pressure when testing each part than the prior art designs.

Accordingly, it is an object of the present invention to provide an improved testing apparatus for testing molded carrier ring products or products similar thereto.

Another object of the present invention is to provide a testing apparatus which does not use a pick and place method.

An additional object of the present invention is to provide a testing apparatus that is less expensive than those used in the prior art.

A further object of the present invention is to provide a testing apparatus which provides for easy and proper alignment of the leads of the molded carrier ring product to the contacts of the testing apparatus.

Yet another object of the present invention is to provide a testing apparatus which does not require that the contacts be soldered to the apparatus.

SUMMARY OF THE INVENTION

The above and other objects and advantages of the present invention are achieved by providing a testing apparatus which utilizes a part guide rather than a pick and place method that uses locating pins, to align a molded carrier ring product. The part guide is fabricated so that the inside edges are just slightly larger than the maximum width across the molded carrier ring leads. The part guide gives precise alignment of the molded carrier ring product to contacts of the testing apparatus. The part guide also protects the contacts from being damaged. In addition, the contacts are easily replaced if damaged, because they do not need to be soldered to the testing apparatus. The part guide may be fabricated of metal, thus making it very durable.

BRIEF DESCRIPTION OF THE DRAWINGS

FIG. 3 illustrates a cross-sectional, side view of a portion of a testing apparatus and a molded carrier ring product under test according to an embodiment of the present invention; and FIG. 4 illustrates a top view of an embodiment of a contact assembly in accordance with the present invention.

DETAILED DESCRIPTION OF THE INVENTION

Figure 1:
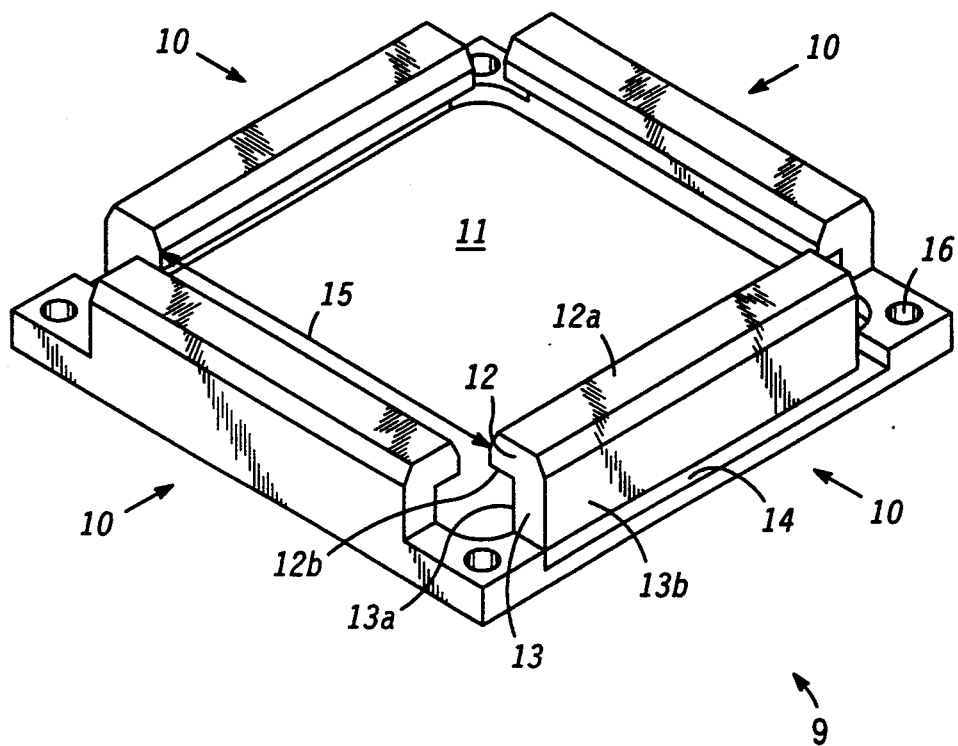
FIG. 1 illustrates a perspective view of a part guide according to an embodiment of the present invention.

FIG. 1 illustrates a perspective view of a part guide used in the testing apparatus of the present invention. Part guide 9 is fabricated having four sides 10 and a square shaped opening 11; each side 10 may have a horizontal portion 12, a vertical portion 13, and a base 14. FIG. 1 is shown with only two sides having a base 14 because only two are necessary for testing a package using a test pocket (shown in FIG. 3). A base 14 may not be necessary if a pick and place method is used. Horizontal portion 12 has a top portion 12a and a bottom portion 12b. Top portion 12a is adapted to guide a semiconductor device, a molded carrier ring product (not shown), into position for testing and is preferably slightly bevelled close to top portion 12a in order to ensure proper alignment of a molded carrier ring product that is not centered in opening 11 as it is being placed. Vertical portion 13 has an inside portion 13a and an outside portion 13b. The size of opening 11, measured from the edges of bottom portions 12b of each side 10 and illustrated by line 15, is made to be just slightly larger than the maximum width across the molded carrier ring leads. Part guide 9 may be screwed down to a printed circuit board for testing semiconductor devices (not shown) by placing screws through the printed circuit board for testing semiconductor and into openings 16 provided at the corners of part guide 9. Part guide 9 may be fabricated of any hard material, but is preferably made of a metal for durability.

Figure 2:
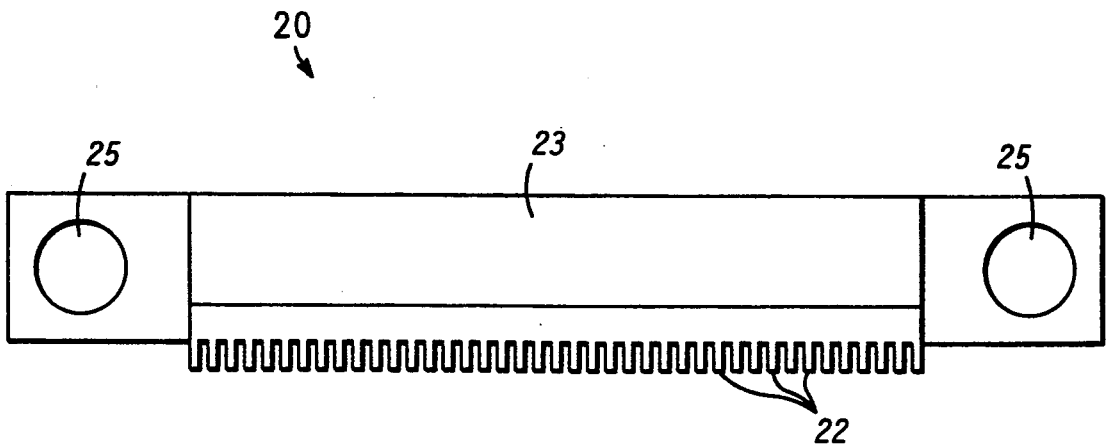
FIG. 2 illustrates a top view of a contact spacer used in an embodiment of the present invention.

FIG. 2 illustrates a top view of a contact spacer 20 utilized in the present invention. Contact spacer 20 is configured to be placed below part guide 9. This is better illustrated in FIG. 3 and will be further described with reference to FIG. 3. Contact spacer 20 is held in position by lining up openings 16 (shown in FIG. 1) of part guide 9 and coinciding openings 25 in base portion 23 of contact spacer 20. A plurality of spacers 22 are provided along the top of contact 20. The function of spacers 22 is discussed with reference to FIG. 3. Contact spacer 20 is preferably made of a plastic. If part guide 9 is also made of plastic, part guide 9 and contact spacer 20 may be molded together. Note that four contact spacers 20 are placed together, but can be all one molded piece. It is desirable to have each side be separate, because the replacement cost is lower if only one side is damaged and needs to be replaced.

FIG. 3 illustrates a cross-sectional, side view of a testing apparatus and a device under test according to one embodiment of the present invention. Shown in FIG. 3 is a contact spacer 20 positioned next to part guide 9, a contact assembly 30 positioned next to contact spacer 20, and a device under test, a molded carrier ring product 40. A semiconductor device 49 is packaged in molded carrier ring product 40. Contact spacer 20 is shown to have a vertical portion 21 and horizontal base portion 23, wherein vertical portion 21 of contact spacer 20 is positioned next to bottom portion 12b of horizontal portion 12 and inside portion 12a of the vertical portion 13 of each side 10 of part guide 9, and horizontal base portion 23 is positioned next to base 14 of part guide 9. FIG. 4 illustrates a top view of contact assembly 30. Shown in FIG. 4 are openings 35 and contacts 32 positioned in contact assembly 30. Contacts 32 are better illustrated in FIG. 3, because FIG. 4 illustrates a simplified top view. Referring to FIG. 3, contact spacer 20 and contact assembly 30 may be held into position by lining up openings 16 (shown in FIG. 1) of part guide 9 and coinciding openings 25 (shown in FIG. 2) in contact spacer 20 and similar openings 35 (shown in FIG. 4) in contact assembly 30. Spacers 22 are provided on contact spacer 20 along bottom portion 12b of horizontal portion 12 of part guide 9. Spacers 22 are fabricated so that contacts 32 in contact assembly 30 fit into spacers 22, and thus contacts 32 are prevented from touching each other. FIG. 3 shows a cross-section right through one of spacer 22 so that contact 32 is shown fully. Only one part lead, 41 of molded carrier ring product 40 or semiconductor device 49 is shown to be touching contact 32. Contact 32 is held in position by contact assembly 30. Contact 32 does not have to be soldered to contact assembly 30 and a test board because the spring action, shown by line 34, in contact 32 and a slot 33 in contact assembly 30 keeps it in position. Part guide 9 provides for accurate alignment of lead 41 of molded carrier ring product 40 to contact 32. Contact 32 serves as an electrical contact between lead 41 and test equipment used to electrically test an integrated circuit packaged in molded carrier ring 40.

A test pocket 50, shown in this embodiment, is used to place molded carrier ring product 40 in opening 11 (illustrated in FIG. 1) of part guide 9. The use of test pocket 50 is only one way in which molded carrier ring product 40 is put into place. Molded carrier ring product 40 may be positioned by the use of a pick and place process, however the use of test pocket 50 is more advantageous because it causes less strain on the leadframe of molded carrier ring product 40. Test pocket 50 may be fabricated of any hardened material such as a moldable non-conductive plastic. Test pocket 50 is configured to hold molded carrier ring product 40 and place molded carrier ring product 40 into proper alignment to the testing apparatus.

The present invention allows for precise location of molded carrier ring product 40 and a very durable testing apparatus. Note that this design may be used for any product where electrical contact is made on all four outside edges of the device. The present invention is very durable and allows for less contact damage, and in addition may provide for increased throughput in testing.

I claim:

1. An apparatus for a test assembly, comprising: a part guide having four sides and an opening, each side having a horizontal portion, and a vertical portion, and wherein the horizontal portion has a top portion and a bottom portion, the vertical portion has an inside portion and an outside portion, and wherein the opening is adapted to guide a molded carrier ring product into position for testing, and contact spacers each having a vertical portion and a horizontal base portion, and wherein the vertical portion of the contact spacer is positioned next to the bottom portion of the horizontal portion and the inside portion of the vertical portion of each side of the part guide and the horizontal base portion is positioned underneath the vertical portion of the part guide, and wherein spacers on the contact spacer are along the bottom portion of the horizontal portion of the part guide.

2. An apparatus for a test assembly, comprising: a part guide having four sides and an opening, each side having a horizontal portion, a vertical portion, and at least two sides having a base extending from the vertical portion, and wherein the horizontal portion has a top portion and a bottom portion, the vertical portion has an inside portion and an outside portion, and wherein the opening is adapted to guide a molded carrier ring product into position for testing, and contact spacers each having a vertical portion and a horizontal base portion, and wherein the vertical portion of the contact spacer is positioned next to the bottom portion of the horizontal portion and the inside potion of the vertical portion of each side of the part guide and the horizontal base portion is positioned underneath the vertical portion of the part guide, and wherein spacers on the contact spacer are along the bottom portion of the horizontal portion of the part guide.

3. The apparatus of claim 2 further comprising: a contact assembly positioned next to the bottom of each contact spacer, wherein the contact assembly is configured to allow placement of a contact through the contact assembly and in between a spacer of the contact spacer.

4. The apparatus of claim 3 wherein the bottom portion of the contact assembly and the contact is configured to keep the contact in place without the use of solder.

5. The apparatus of claim 3 wherein the part guide, the contact spacer, and the contact assembly have openings for screws to hold the part guide, the contact spacer, and the contact assembly into position.

* * * * *